(12) United States Patent
Hula

(10) Patent No.: US 6,455,836 B1
(45) Date of Patent: Sep. 24, 2002

(54) METALLIC OPTICAL BARRIER FOR PHOTO-DETECTOR ARRAY IS ALSO INTERCONNECTING ELECTRODE

(75) Inventor: David W Hula, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/558,461

(22) Filed: Apr. 25, 2000

(51) Int. Cl.[7] ............................................... H01J 40/14
(52) U.S. Cl. ............................. 250/214 R; 250/208.1; 250/214.1; 257/435
(58) Field of Search ........................ 250/214 R, 208.1, 250/208.2; 257/9, 10, 59, 72, 215, 225, 257, 258, 435, 437, 443

(56) References Cited

U.S. PATENT DOCUMENTS 5,151,385 A * 9/1992 Yamamoto et al. ......... 437/181
6,326,601 B1 * 12/2001 Hula et al. ............... 250/208.1

* cited by examiner

Primary Examiner—Robert H. Kim
Assistant Examiner—Courtney Thomas
(74) Attorney, Agent, or Firm—Edward L. Miller

(57) ABSTRACT

The number of masking operations needed to connect photo-return current to ground or a bias potential can be reduced by collecting and rearranging the conventional steps to become:

(A) Depositing a P layer of hydrogenated amorphous silicon (a-Si:H) upon an underlying layer of intrinsic hydrogenated amorphous silicon, and a layer of conductive ITO on top of the P layer;

(B) Patterning all three of the layers deposited in step (A); and (C) Depositing and then patterning the layer of W that serves as the optical barrier.

The above steps (A)–(C) require only two masking operations, in comparison to three for the conventional method. In addition, the W layer can be used to connect the ITO to ground or the bias potential.

7 Claims, 3 Drawing Sheets

METALLIC OPTICAL BARRIER FOR PHOTO-DETECTOR ARRAY IS ALSO INTERCONNECTING ELECTRODE

REFERENCE TO RELATED APPLICATION

The subject matter of this application is related to that which is disclosed in U.S. patent application Ser. No. 09/356,560 entitled OPTICAL BARRIER and filed on Jul. 19,1999 by David W. Hula and Philip G. Nikkel. That Application is hereby expressly incorporated herein by reference.

BACKGROUND OF THE INVENTION

Digital imaging devices often employ arrays of photo-detectors fabricated within an integrated circuit (IC). For example, a digital camera may employ an IC having an array of PIN diodes, where the P and the N refer to the presence of the normal positive and negative ionic dopants for silicon, and the I represents an intervening layer of intrinsic (undoped) silicon. Arrays of other types of photo-detectors are also possible, and the imaging device might be a scanner for a document or some other type of facsimile machine (e.g., an "office copier"). In any event, it is often the case that the portion of the photo detector array structure that is nearest the exposing to light (i.e., the optical surface upon which an image is focused or registered) is electrically common to each photo-detector in the array, functions as photo current return, and needs to be electrically connected to either ground or perhaps some bias potential. The common connection to all the photo-detectors in the array is accomplished by coating the optical surface of the photo-detector array with a conductive layer that is optically transparent, such as ITO (Indium Tin Oxide). Beneath the coated optical surface are the differentiated structures in the semiconductor material that serve as individual optical sensors at the pixel level, and that are each connected to some form of measurement circuitry through a buffer mechanism, such as a source follower.

Ideally, the signal level associated with each individual pixel sensor would be a function only of the amount of light reaching it. In practice, this is not the case and there is an additional "dark current" whose presence, if not accounted for, degrades the quality of the resulting image. The first step in accounting for dark current is to measure it. Actual measurements of the dark current for each individual pixel are often impractical. For example, to do so might require an actual optical shutter mechanism that is undesirable for various reasons. Fortunately, there is an excellent compromise where certain optical sensors (say, around the periphery) are fabricated as part of the array but are never exposed to light. The dark current of these sensors is measured, averaged and used as an indicator of the dark current for the balance of the array. An optical barrier, such as one of Tungsten (W) as described in the incorporated Specification, can be used for this purpose.

One conventional fabrication technique for an array of the sort that is described above involves the following steps:

(a) Depositing a P layer of hydrogenated amorphous silicon (a-Si:H) upon an underlying layer of intrinsic hydrogenated amorphous silicon;

(b) Patterning the P layer and the underlying intrinsic layer of hydrogenated amorphous silicon;

(c) Depositing and then patterning the layer of conductive ITO; and (d) Depositing and then patterning the layer of W that serves as the optical barrier.

In the terminology of IC fabrication, there are three masking operations needed to carry out the above steps. Each masking operation requires time and expense expended during production, and each masking operation can contribute additional complexity that may become the occasion for various failure mechanisms.

Thus, it would be desirable if the number of masking operations needed could be reduced. In addition, it will be remembered that the layer of ITO needs to be connected to ground or to a bias potential. It is then further desirable for there to be a way to connect the layer of ITO to ground or a bias potential without incurring a penalty in terms of additional masking operations and/or decreased yield. What to do?

SUMMARY OF THE INVENTION

The number of masking operations needed can be reduced by collecting and rearranging the steps listed above to become:

(A) Depositing a P layer of hydrogenated amorphous silicon (a-Si :H) upon an underlying layer of intrinsic hydrogenated amorphous silicon, and a layer of conductive ITO on top of the P layer;

(B) Patterning all three of the layers deposited in step (A); and (C) Depositing and then patterning the layer of W that serves as the optical barrier.

The above steps (A)–(C) require only two masking operations. In addition, the W layer can be used to connect the ITO to ground or the bias.

DESCRIPTION OF A PREFERRED EMBODIMENT

Figure 1:
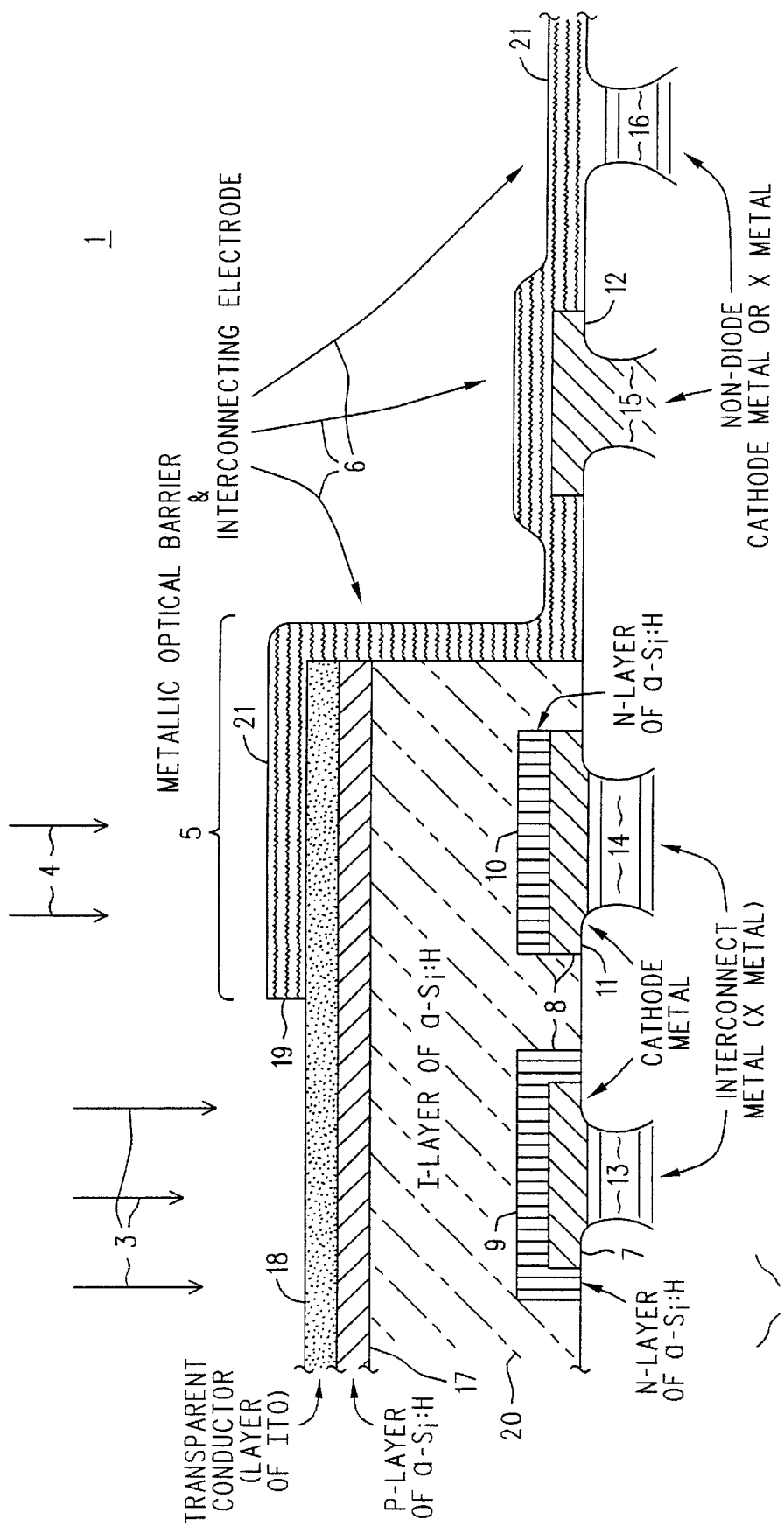
FIG. 1 is a simplified cross sectional view of an array of optical sensors fabricated upon an integrated circuit in accordance with the principles of the invention.

Refer now to FIG. 1, wherein is shown a simplified representation 1 of a cross sectional view of an array of optical sensors fabricated upon an integrated circuit. In particular, a base portion 2 of the integrated circuit indicates generally any other type of circuitry that may be part of the IC and also serves as a location upon which to fabricate the array of optical sensors. The figure shows only two optical sensors along a single dimension. It will be understood, however, that while a single dimension is possible (e.g., after the fashion of contact image sensors) the more typical case is that there is a two dimensional array of N×N or M×N optical sensors, where M and N could be rather large, say, in the range of several hundred to over a thousand.

To begin, then, the array of optical sensors, which, of course, will be light sensitive semiconductors of one sort or another, begins as an array of rudimentary pixel elements. In one preferred embodiment the optical sensors are PIN diodes, and the rudimentary pixel elements are depositions of regions of cathode metal 7, 11. Other optical sensors could be used, such as PN diodes and photo transistors, and they might begin differently. Suitable cathode metals comprise Titanium Nitride, Tungsten, Titanium Tungsten and Tungsten, among others. These depositions (7, 11) of cathode metal could either be about the size of the desired pixel element and formed upon a comparable emergence (13, 14) of interconnect metal (X Metal), or, they (7,11) might be simply the terminal ends of interconnecting runs of cathode metal. The former case is typical when the number of pixel elements is high and they are formed in two dimensions, thus presenting trace routing issues that require multiple planes of interconnecting traces, while the latter case may suffice if the number of pixel elements is small or is arranged along a single dimension. This aspect of IC fabrication is well understood, and it will be noted that the interconnect metal may or may not be the same as the cathode metal.

Continuing, cathode metal depositions 7 and 11 receive layers of doped silicon, which in a preferred embodiment is N-type hydrogenated amorphous silicon (a-Si:H). Two alternate styles of such N-layers are possible. Layer 10 is simply "on top of"(coextensive with) its underlying layer 11 of cathode metal, while layer 9 encloses its underlying layer 7 by covering the exposed side edges as well as the top. Which way this is done is a matter of choice. N-layers 9 and 10, in conjunction with their respective depositions 7 and 11 of cathode metal, comprise cathode portions 8 of the desired PIN diodes. The fabrication of such cathode portions 8 is also well understood.

The cathode portions 8 are covered by an I-layer 20 of intrinsic silicon. Onto I-layer 20 is deposited a P-layer 17 of a-Si:H. The P-layer 17 forms the anodes of the PIN diodes in the array of optical sensors. Again, these steps are well understood.

A layer 18 of an transparent conductor, such as Indium Tin Oxide (ITO) is deposited onto the P-layer 17. Its purpose is to allow incident light to pass through to the diodes below while effectively shunting the sideways anode-to-anode resistivity of the P-layer 17 and connecting the anode of each diode to a common location through a low resistance path. This common connection of all the anodes is part of a photo current return path, which is typically connected to ground, or perhaps to a bias supply. One issue we are concerned with is how to get the transparent conductor layer 18 of ITO connected to such a ground or bias supply.

Meanwhile, note the layer 21 of Tungsten (W). Part of it is deposited around the periphery of the array of optical sensors. We may term those PIN diodes that are nearest the periphery (i.e., on the edge of the array, as it were) as being in a boundary region defined by the extent of an metallic optical barrier 5 that is the part of W layer 21 which is deposited onto the layer 18 of ITO. What this does is obscure incident light 4 from reaching optical sensors (such as the one whose cathode is 10). Such sensors in the boundary region defined by the extent 5 of the W layer 21 are used to measure dark current, as mentioned earlier and as described in the incorporated Patent Application. For completeness, it will also be noted that edge 19 of the extent 5 not only defines the boundary region for dark current measurement, but also is the periphery of an optical aperture (in the optical barrier) through which incident light 3 reaches those optical sensors (e.g., the one whose cathode is 9) in the array thereof that may be used to form an actual image.

Now consider the question of how to get the layer 18 of ITO (or other transparent conductor) electrically connected to a desired place on the IC. The W layer 21, which is otherwise only an optical barrier, can serve as such an interconnecting electrode 6. As shown in FIG. 1, the W layer 21 can be deposited right down the raised side of the array of optical sensors and onto the base portion 2 of the IC, where it makes electrical contact with a desired trace or interconnect thereto (12/15 or 16). Both 12/15 and 16 are shown; the choice of which to use in a given implementation would depend upon the surrounding circumstances. One can even contemplate that the interconnecting electrode 6 might simply be necked down to a trace and routed to some location without recourse to inter-layer connections such as 12/15 or 16. Finally, an alternate situation could occur where the array of optical sensors is fabricated in a recess in the substrate material, such that when completed the W layer 21 either goes "up" to get out (instead of "down," as shown) or simply goes straight across.

Figure 2:
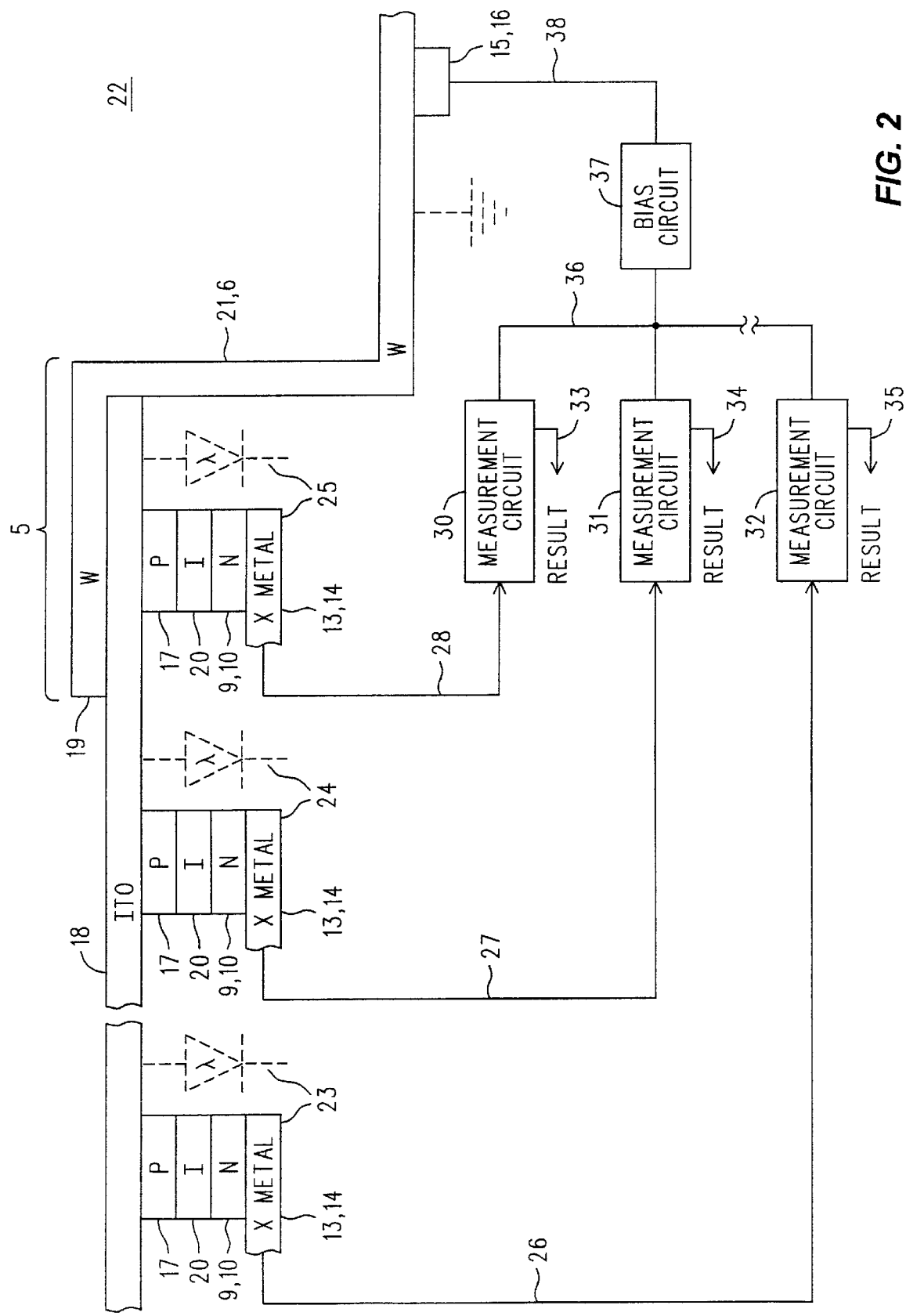
FIG. 2 is a simplified and fancifully stylized schematic diagram illustrating circuitry resulting from an application of the principles of FIG. 1.

Refer now to FIG. 2, which is a simplified and fancifully stylized schematic diagram illustrating circuitry resulting from an application of the principles of FIG. 1. Most of the reference characters that refer to structures in the silicon of the IC are the same as their counterparts in FIG. 1. Note that the PIN diodes 23–25 and their associated cathode or interconnect metals are depicted in rectangular box fashion, while dotted line diode symbols are provided for schematic flavor. Each diode 23–25 is connected by a respective conductor 26–28 to a respective measurement circuit 30–32. Each measurement circuit (e.g., an analog to digital converter) produces a corresponding result 33–35 which is sent someplace appropriate (and beyond the scope of this disclosure). Typically, each measurement circuit is connected (36) to a bias circuit 37 that creates the potential emf to produce the photo current in illuminated optical detectors. The bias circuit is connected (38, 15, 16) to the Tungsten interconnecting electrode 6, which is typically grounded.

Figure 3:
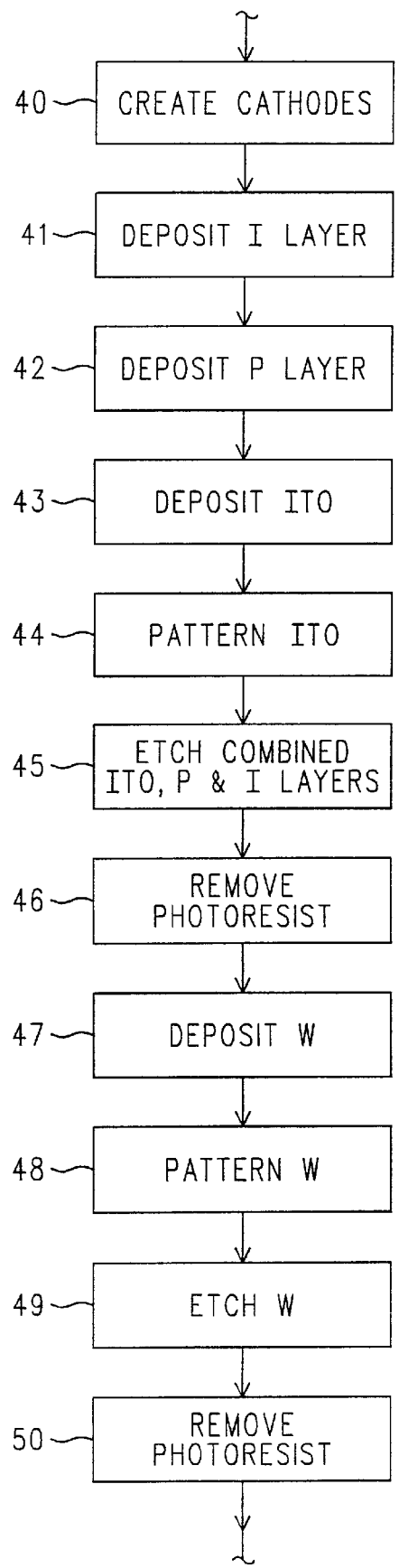
FIG. 3 is a simplified flow chart describing a method associated with FIG. 1.

Refer now to FIG. 3, wherein is depicted a simplified processing flow chart segment 39 that describes a processing method that is associated with the practice of the invention. The flow chart segment 39 pertains to how a structure like the one in FIG. 1 may be fabricated with less than the conventional number of masking operations. It will be appreciated that we deal here with only a segment of the entire processing sequence needed to fabricate an IC, since there may well be both preceding and subsequent steps that, while needed for actual production of one IC or another, are omitted here both for brevity and also because they fall outside the scope of enablement for the inventive method and do not relate to the best mode of carrying out that method.

In particular, step 40 is to create the cathodes (8). Following cathode creation, step 41 is the deposition of the I-layer (20), in turn followed by step 42, which is the deposition of the P-layer (17). Next is step 43, which is the deposition of the transparent conductor (layer of ITO 18). Then there is a first masking operation involved with step 44, which is to pattern the ITO layer 18. In a conventional method there would be an earlier patterning step operating on the P-layer (17), but it will be noted that such a step is absent from flow chart segment 39.

Step 45 is to etch the combined layers of ITO, P an I material. Being on top, the layer of ITO is etched first, and may then serve as permanent in-place mask for etching the other layers. Whether the same or different etchants are involved in the etching of the combined layers is a matter of choice and may depend on other process parameters. In any event, once the ITO, P and I layers have been etched, step 46 is the removal of the photo resist from the remaining ITO.

The remaining steps 47–50 deal with the deposition and etching of the layer 21 of W. Step 47 is the deposition of the layer 21 of W. Note that this step (47) may include a deposition of W material that also forms the interconnecting electrode 6 (of FIG. 1). Step 48 is the second masking operation mentioned in the Summary Of The Invention, and is the patterning of the layer of W. Step 49 is to etch the W (which may include the formation of an optical barrier) and step 50 is the removal of the photo resist. Thus, there has now been created an IC structure, such as the one shown in FIG. 1, using one less masking operation than conventionally needed, and also one that could have an interconnection electrode of W that might also be an optical barrier.

I claim:

1. An array of photo detectors within an integrated circuit, the array comprising:

a collection of pixel elements each electrically coupled to a corresponding measurement circuit;

a layer of doped material that is coextensive with the collection of pixel elements and that forms therewith an array of light sensitive semiconductors;

a layer of transparent conductor upon and coextensive with the layer of doped material and serving as a return path for photo currents flowing within individual light sensitive semiconductors;

the array of light sensitive semiconductors having a physical perimeter adjacent to which is a boundary region containing some of the light sensitive semiconductors; and a layer of optically opaque metal upon a portion of the layer of transparent conductor which is proximate the physical perimeter, the layer of optically opaque metal extending onto a central region of the layer of transparent conductor to form an optical perimeter enclosing a region having a light sensitive conductors responsive to incident light while obscuring from incident light the light sensitive conductors in the boundary region, and also extending away from the central region to make electrical contact with at least one terminal that carries return path photo current.

2. An array of photo detectors as in claim 1 further comprising a layer of intrinsic silicon interposed between the collection of pixel elements and the layer of doped material.

3. An array of photo detectors as in claim 2 wherein the light sensitive semiconductors are PIN diodes.

4. An array of photo detectors as in claim 1 wherein the transparent conductor is Indium Tin Oxide.

5. An array of photo detectors as in claim 1 wherein the optically opaque metal is Tungsten.

6. A method of integrated circuit fabrication comprising the steps of:

depositing at least one layer of silicon, part of which will later be removed;

depositing upon the at least one layer of silicon a layer of transparent conductor;

patterning the layer of transparent conductor;

etching away a portion of the transparent conductor in accordance with the patterning step;

using the patterned and unetched portion of the layer of transparent conductor as a patterning step for the at least one layer of silicon to define that part thereof that is to be removed; and etching away the part of the at least one layer of silicon that is to be removed.

7. A method as in claim 6 further comprising the steps of:

subsequent to the steps of claim 6, depositing onto the transparent conductor a layer of metal that is in electrical contact with a potential that it is desired to connect the layer of transparent conductor;

patterning the layer of metal, the pattern including a path of connection to the potential; and etching the layer of metal.

* * * * *